(12) United States Patent
Dellis et al.

(10) Patent No.: US 11,803,018 B2
(45) Date of Patent: Oct. 31, 2023

(54) DEVICES, SYSTEMS, AND METHODS WITH A PIEZOELECTRIC-DRIVEN LIGHT INTENSITY MODULATOR

(71) Applicant: HI LLC, Los Angeles, CA (US)

(72) Inventors: Argyrios Dellis, Culver City, CA (US); Ethan Pratt, Santa Clara, CA (US); Dakota Blue Decker, Culver City, CA (US); Kayla Wright-Freeman, Pasadena, CA (US); Micah Ledbetter, Sunnyvale, CA (US); Geoffrey Iwata, Los Angeles, CA (US)

(73) Assignee: HI LLC, Los Angeles, CA (US)

( * ) Notice: Subject to any disclaimer, the term of this patent is extended or adjusted under 35 U.S.C. 154(b) by 41 days.

(21) Appl. No.: 17/572,404

(22) Filed: Jan. 10, 2022

(65) Prior Publication Data

US 2022/0221665 A1 Jul. 14, 2022

Related U.S. Application Data

(60) Provisional application No. 63/189,870, filed on May 18, 2021, provisional application No. 63/136,415, filed on Jan. 12, 2021.

(51) Int. Cl.
*G02B 6/32* (2006.01)
*H02N 2/04* (2006.01)
*G02B 6/42* (2006.01)

(52) U.S. Cl.
CPC ............ *G02B 6/4226* (2013.01); *G02B 6/32* (2013.01); *G02B 6/4206* (2013.01); *H02N 2/04* (2013.01)

(58) Field of Classification Search
CPC .................... G02B 6/32; H02N 2/04

USPC .......................................... 385/52
See application file for complete search history.

(56) References Cited

U.S. PATENT DOCUMENTS

| 3,173,082 A | 3/1965 | Bell et al. |
| 3,257,608 A | 6/1966 | Bell et al. |
| 3,495,161 A | 2/1970 | Bell |
| 3,501,689 A | 3/1970 | Robbiano |

(Continued)

FOREIGN PATENT DOCUMENTS

| CN | 104730484 | 6/2015 |
| CN | 107562188 | 1/2018 |

(Continued)

OTHER PUBLICATIONS

Okada, Y.C., Lahteenmäki, A. and Xu, C., "Experimental analysis of distortion of magnetoencephalography signals by the skull." Clinical neurophysiology 110 (2), 230-238 (1999).

(Continued)

*Primary Examiner* — Kaveh C Kianni
(74) *Attorney, Agent, or Firm* — Branch Partners PLLC; Bruce E. Black (57) ABSTRACT

A light intensity modulator includes an input optical fiber; an output optical fiber; an optical arrangement having a lens, where the optical arrangement is configured to receive light from the input optical fiber, pass the light through the lens, and direct the light to the output optical fiber; and a piezoelectric device coupled to the lens, where the piezoelectric device is configured for moving the lens to alter overlap of the output optical fiber and the light directed to the output optical fiber to modulate intensity of light in the output optical fiber.

20 Claims, 4 Drawing Sheets

(56) References Cited

U.S. PATENT DOCUMENTS

| | | | |
|---|---|---|---|
| 3,513,381 A | 5/1970 | Happer, Jr. | |
| 4,193,029 A | 3/1980 | Cioccio et al. | |
| 4,349,815 A * | 9/1982 | Spooner | G02B 27/0172 |
| | | | 340/980 |
| 4,562,344 A * | 12/1985 | Mihara | G02B 23/2407 |
| | | | 250/201.4 |
| 4,594,504 A * | 6/1986 | Coursolle | G02B 6/266 |
| | | | 250/227.21 |
| 4,951,674 A | 8/1990 | Zanakis et al. | |
| 5,189,368 A | 2/1993 | Chase | |
| 5,192,921 A | 3/1993 | Chantry et al. | |
| 5,225,778 A | 7/1993 | Chaillout et al. | |
| 5,254,947 A | 10/1993 | Chaillout et al. | |
| 5,265,179 A * | 11/1993 | Ishiguro | G02B 6/32 |
| | | | 385/33 |
| 5,309,095 A | 5/1994 | Ahonen et al. | |
| 5,442,289 A | 8/1995 | Dilorio et al. | |
| 5,444,372 A | 8/1995 | Wikswo, Jr. et al. | |
| 5,471,985 A | 12/1995 | Warden | |
| 5,506,200 A | 4/1996 | Hirschkoff et al. | |
| 5,526,811 A | 6/1996 | Lypchuk | |
| 5,713,354 A | 2/1998 | Warden | |
| 6,144,872 A | 11/2000 | Graetz | |
| 6,175,667 B1 * | 1/2001 | Wang | G02F 1/0551 |
| | | | 359/247 |
| 6,339,328 B1 | 1/2002 | Keene et al. | |
| 6,472,869 B1 | 10/2002 | Upschulte et al. | |
| 6,665,553 B2 | 12/2003 | Kandori et al. | |
| 6,806,784 B2 | 10/2004 | Hollberg et al. | |
| 6,831,522 B2 | 12/2004 | Kitching et al. | |
| 6,943,871 B1 * | 9/2005 | Abedin | G01M 11/338 |
| | | | 356/73.1 |
| 7,038,450 B2 | 5/2006 | Romalis et al. | |
| 7,102,451 B2 | 9/2006 | Happer et al. | |
| 7,145,333 B2 | 12/2006 | Romalis et al. | |
| 7,521,928 B2 | 4/2009 | Romalis et al. | |
| 7,565,040 B2 * | 7/2009 | Nagaeda | G02F 1/0316 |
| | | | 385/11 |
| 7,656,154 B2 | 2/2010 | Kawabata et al. | |
| 7,826,065 B1 | 11/2010 | Okandan et al. | |
| 7,872,473 B2 | 1/2011 | Kitching et al. | |
| 7,994,783 B2 | 8/2011 | Ledbetter et al. | |
| 8,054,074 B2 | 11/2011 | Ichihara et al. | |
| 8,212,556 B1 | 7/2012 | Schwindt et al. | |
| 8,258,884 B2 | 9/2012 | Borwick, III et al. | |
| 8,319,156 B2 | 11/2012 | Borwick, III et al. | |
| 8,334,690 B2 | 12/2012 | Kitching et al. | |
| 8,373,413 B2 | 2/2013 | Sugioka | |
| 8,405,389 B2 | 3/2013 | Sugioka et al. | |
| 8,531,676 B2 * | 9/2013 | Condit | G02B 3/14 |
| | | | 356/497 |
| 8,587,304 B2 | 11/2013 | Budker et al. | |
| 8,836,327 B2 | 9/2014 | French et al. | |
| 8,906,470 B2 | 12/2014 | Overstolz et al. | |
| 8,941,377 B2 | 1/2015 | Mizutani et al. | |
| 9,084,549 B2 | 7/2015 | Desain et al. | |
| 9,095,266 B1 | 8/2015 | Fu | |
| 9,116,201 B2 | 8/2015 | Shah et al. | |
| 9,140,590 B2 | 9/2015 | Waters et al. | |
| 9,140,657 B2 | 9/2015 | Ledbetter et al. | |
| 9,169,974 B2 | 10/2015 | Parsa et al. | |
| 9,244,137 B2 | 1/2016 | Kobayashi et al. | |
| 9,291,508 B1 | 3/2016 | Biedermann et al. | |
| 9,343,447 B2 | 3/2016 | Parsa et al. | |
| 9,366,735 B2 | 6/2016 | Kawabata et al. | |
| 9,383,419 B2 | 7/2016 | Mizutani et al. | |
| 9,395,425 B2 | 7/2016 | Diamond et al. | |
| 9,417,293 B2 | 8/2016 | Schaffer et al. | |
| 9,429,918 B2 | 8/2016 | Parsa et al. | |
| 9,568,565 B2 | 2/2017 | Parsa et al. | |
| 9,575,144 B2 | 2/2017 | Kornack et al. | |
| 9,601,225 B2 | 3/2017 | Parsa et al. | |
| 9,638,768 B2 | 5/2017 | Foley et al. | |
| 9,639,062 B2 | 5/2017 | Dyer et al. | |
| 9,677,905 B2 | 6/2017 | Waters et al. | |
| 9,726,626 B2 | 8/2017 | Smith et al. | |
| 9,726,733 B2 | 8/2017 | Smith et al. | |
| 9,759,545 B2 * | 9/2017 | Mukoh | G01B 9/02007 |
| 9,791,536 B1 | 10/2017 | Alem et al. | |
| 9,829,544 B2 | 11/2017 | Bulatowicz | |
| 9,829,639 B1 * | 11/2017 | Birman | G02B 6/29313 |
| 9,846,054 B2 | 12/2017 | Waters et al. | |
| 9,851,418 B2 | 12/2017 | Wolf et al. | |
| 9,869,731 B1 | 1/2018 | Hovde et al. | |
| 9,915,711 B2 | 3/2018 | Kornack et al. | |
| 9,927,501 B2 | 3/2018 | Kim et al. | |
| 9,948,314 B2 | 4/2018 | Dyer et al. | |
| 9,964,609 B2 | 5/2018 | Ichihara et al. | |
| 9,964,610 B2 | 5/2018 | Shah et al. | |
| 9,970,999 B2 | 5/2018 | Larsen et al. | |
| 9,995,800 B1 | 6/2018 | Schwindt et al. | |
| 10,024,929 B2 | 7/2018 | Parsa et al. | |
| 10,088,535 B1 | 10/2018 | Shah | |
| 10,162,016 B2 | 12/2018 | Gabrys et al. | |
| 10,194,865 B2 | 2/2019 | Le et al. | |
| 10,314,508 B2 | 6/2019 | Desain et al. | |
| 10,371,764 B2 | 8/2019 | Morales et al. | |
| 10,674,919 B2 * | 6/2020 | Banke | A61B 5/7221 |
| 10,772,561 B2 | 9/2020 | Donaldson | |
| 2002/0085594 A1 * | 7/2002 | Pezeshki | G02B 26/0816 |
| | | | 372/20 |
| 2002/0085806 A1 * | 7/2002 | Pezeshki | H01S 5/4031 |
| | | | 372/109 |
| 2003/0002791 A1 * | 1/2003 | Cao | G02B 6/272 |
| | | | 385/24 |
| 2003/0048540 A1 * | 3/2003 | Xie | G02B 21/0056 |
| | | | 359/637 |
| 2004/0232912 A1 | 11/2004 | Tsukamoto et al. | |
| 2005/0007118 A1 | 1/2005 | Kitching et al. | |
| 2005/0046851 A1 | 3/2005 | Riley, Jr. et al. | |
| 2005/0157291 A1 * | 7/2005 | Bustamante | G02B 27/62 |
| | | | 356/400 |
| 2005/0206377 A1 | 9/2005 | Romalis et al. | |
| 2007/0120563 A1 | 5/2007 | Kawabata et al. | |
| 2007/0167723 A1 | 7/2007 | Park et al. | |
| 2007/0201807 A1 * | 8/2007 | Furusawa | G02B 6/3582 |
| | | | 385/137 |
| 2007/0205767 A1 | 9/2007 | Xu et al. | |
| 2007/0291346 A1 * | 12/2007 | Nagaeda | G02F 1/0316 |
| | | | 359/254 |
| 2008/0194947 A1 * | 8/2008 | Kokkelink | A61B 5/0073 |
| | | | 600/425 |
| 2009/0079426 A1 | 3/2009 | Anderson | |
| 2009/0079993 A1 * | 3/2009 | Yatagai | A61B 5/7257 |
| | | | 356/497 |
| 2009/0101806 A1 | 4/2009 | Masuda | |
| 2010/0140503 A1 * | 6/2010 | Sugiura | G01N 21/6452 |
| | | | 250/459.1 |
| 2010/0219820 A1 | 9/2010 | Skidmore et al. | |
| 2011/0062956 A1 | 3/2011 | Edelstein et al. | |
| 2012/0112749 A1 | 5/2012 | Budker et al. | |
| 2012/0128301 A1 * | 5/2012 | Vallee | G02B 6/02142 |
| | | | 385/33 |
| 2012/0235036 A1 * | 9/2012 | Hatakeyama | H01J 37/20 |
| | | | 250/310 |
| 2013/0082700 A1 | 4/2013 | Mizutani et al. | |
| 2013/0082701 A1 | 4/2013 | Mizutani et al. | |
| 2013/0265042 A1 | 10/2013 | Kawabata et al. | |
| 2014/0121491 A1 | 5/2014 | Zhang | |
| 2014/0204389 A1 * | 7/2014 | Mukoh | G01B 9/02007 |
| | | | 356/479 |
| 2014/0306700 A1 | 10/2014 | Kamada et al. | |
| 2014/0354275 A1 | 12/2014 | Sheng et al. | |
| 2015/0022200 A1 | 1/2015 | Ichihara et al. | |
| 2015/0054504 A1 | 2/2015 | Ichihara et al. | |
| 2015/0378316 A1 | 12/2015 | Parsa et al. | |
| 2016/0061913 A1 | 3/2016 | Kobayashi et al. | |
| 2016/0084709 A1 * | 3/2016 | Day | G02B 26/10 |
| | | | 356/318 |
| 2016/0116553 A1 | 4/2016 | Kim et al. | |
| 2016/0223627 A1 | 8/2016 | Shah et al. | |
| 2016/0291099 A1 | 10/2016 | Ueno | |

(56) References Cited

U.S. PATENT DOCUMENTS

| | | | |
|---|---|---|---|
| 2016/0306116 A1* | 10/2016 | Tazawa | G02B 6/3518 |
| 2016/0313417 A1 | 10/2016 | Kawabata et al. | |
| 2017/0023653 A1 | 1/2017 | Kobayashi et al. | |
| 2017/0023654 A1 | 1/2017 | Kobayashi et al. | |
| 2017/0067969 A1 | 3/2017 | Butters et al. | |
| 2017/0199138 A1 | 7/2017 | Parsa et al. | |
| 2017/0261564 A1 | 9/2017 | Gabrys et al. | |
| 2017/0331485 A1 | 11/2017 | Gobet et al. | |
| 2017/0343617 A1 | 11/2017 | Manickam et al. | |
| 2017/0343695 A1 | 11/2017 | Stetson et al. | |
| 2017/0356969 A1 | 12/2017 | Ueno | |
| 2017/0360322 A1 | 12/2017 | Ueno | |
| 2017/0363695 A1 | 12/2017 | Ueno | |
| 2018/0003777 A1 | 1/2018 | Sorenson et al. | |
| 2018/0038921 A1 | 2/2018 | Parsa et al. | |
| 2018/0100749 A1 | 4/2018 | Waters et al. | |
| 2018/0128885 A1 | 5/2018 | Parsa et al. | |
| 2018/0156875 A1 | 6/2018 | Herbsommer et al. | |
| 2018/0219353 A1 | 8/2018 | Shah | |
| 2018/0238974 A1 | 8/2018 | Shah et al. | |
| 2018/0313908 A1 | 11/2018 | Knappe et al. | |
| 2018/0313913 A1 | 11/2018 | DeNatale et al. | |
| 2018/0372813 A1 | 12/2018 | Bulatowicz et al. | |
| 2019/0086192 A1* | 3/2019 | Elmaanaoui | G01B 9/02091 |
| 2019/0391213 A1 | 12/2019 | Alford | |
| 2020/0025844 A1 | 1/2020 | Alford et al. | |
| 2020/0041731 A1* | 2/2020 | Cuno | G02B 6/3843 |
| 2020/0056263 A1 | 2/2020 | Bhattacharyya et al. | |
| 2020/0057115 A1 | 2/2020 | Jiménez-Martínez et al. | |
| 2020/0057116 A1 | 2/2020 | Zorzos et al. | |
| 2020/0064421 A1 | 2/2020 | Kobayashi et al. | |
| 2020/0072916 A1 | 3/2020 | Alford et al. | |
| 2020/0088811 A1 | 3/2020 | Mohseni | |
| 2020/0109481 A1 | 4/2020 | Sobek et al. | |
| 2020/0123416 A1 | 4/2020 | Bhattacharyya et al. | |
| 2020/0191883 A1 | 6/2020 | Bhattacharyya et al. | |
| 2020/0241094 A1 | 7/2020 | Alford | |
| 2020/0256929 A1 | 8/2020 | Ledbetter et al. | |
| 2020/0309873 A1 | 10/2020 | Ledbetter et al. | |
| 2020/0334559 A1 | 10/2020 | Anderson et al. | |
| 2020/0341081 A1 | 10/2020 | Mohseni et al. | |
| 2020/0381128 A1 | 12/2020 | Pratt et al. | |
| 2020/0400763 A1 | 12/2020 | Pratt | |
| 2021/0011094 A1 | 1/2021 | Bednarke | |
| 2021/0015385 A1 | 1/2021 | Katnani et al. | |
| 2021/0015427 A1 | 1/2021 | Shah et al. | |
| 2021/0041512 A1 | 2/2021 | Pratt et al. | |
| 2021/0041513 A1 | 2/2021 | Mohseni | |
| 2021/0063510 A1 | 3/2021 | Ledbetter | |
| 2022/0082697 A1* | 3/2022 | Slotwinski | G02B 26/0875 |

FOREIGN PATENT DOCUMENTS

| | | | |
|---|---|---|---|
| CN | 110742607 | 2/2020 | |
| CN | 110859610 | 3/2020 | |
| EP | 2738627 A3 | 6/2014 | |
| EP | 2380029 B1 | 10/2015 | |
| EP | 3037836 B1 | 9/2017 | |
| JP | H10503853 A * | 10/1998 | |
| JP | 2004305586 A * | 11/2004 | |
| JP | 2016109665 | 6/2016 | |
| JP | 2016206650 A * | 12/2016 | G02B 6/32 |
| JP | 2018004462 | 1/2018 | |
| TW | 200307151 A * | 12/2003 | G02B 6/2821 |
| TW | I240808 B * | 10/2005 | |
| WO | WO-8501117 A1 * | 3/1985 | |
| WO | 92/01362 | 1/1992 | |
| WO | 2005/081794 | 9/2005 | |
| WO | 2014/031985 | 2/2014 | |
| WO | 2017/095998 | 6/2017 | |
| WO | 2020/084194 | 4/2020 | |

OTHER PUBLICATIONS

Robinson, J.T., Pohlmeyer, E., Gather, M.C., Kemere, C., Kitching, J.E., Malliaras, G.G., Marblestone, A., Shepard, K.L., Stieglitz, T. and Xie, C., "Developing Next-Generation Brain Sensing Technologies—A Review." IEEE sensors journal, 19(22), 10163-10175 (2019).

Shah, V., Knappe, S., Schwindt, P.D. and Kitching, J., "Subpicotesla atomic magnetometry with a microfabricated vapour cell." Nature Photon 1, 649-652 (2007).

Griffith, W.C., Knappe, S. and Kitching, J., "Femtotesla atomic magnetometry in a microfabricated vapor cell." Optics express 18, (26), 27167-27172 (2010).

Tierney, T.M., Holmes, N., Mellor, S., López, J.D., Roberts, G., Hill, R.M., Boto, E., Leggett, J., Shah, V., Brookes, M.J. and Bowtell, R., "Optically pumped magnetometers: From quantum origins to multi-channel magnetoencephalography." NeuroImage, 199, 598-608 (2019).

Iivanainen, J., Zetter, R., Grön, M., Hakkarainen, K. and Parkkonen, L., "On-scalp MEG system utilizing an actively shielded array of optically-pumped magnetometers." Neuroimage 194, 244-258 (2019).

Iivanainen, J., Stenroos, M. and Parkkonen, L., "Measuring MEG closer to the brain: Performance of on-scalp sensor arrays." NeuroImage 147, 542-553 (2017).

Kitching, J., Knappe, S., Gerginov, V., Shah, V., Schwindt, P.D., Lindseth, B., Donley E.A., "Chip-scale atomic devices: precision atomic instruments based on MEMS." In Frequency Standards And Metrology, 445-453 (2009).

Kitching, J., Knappe, S. and Donley, E.A., "Atomic sensors-a review." IEEE Sensors Journal, 11(9), 1749-1758 (2011).

Budker, D. and Romalis, M., "Optical magnetometry". Nature physics, 3(4), 227-234 (2007).

Happer, W., "Optical pumping", Rev. Mod. Phys., 44 (2), 169-249 (1972).

Purcell, E.M., Field, G.B., "Influence of collisions upon population of hyperfine states in hydrogen", Astrophys. J., 124, 542 (1956).

Ledbetter, M.P., Savukov, I.M., Acosta, V.M., Budker, D. and Romalis, M.V., "Spin-exchange-relaxation-free magnetometry with Cs vapor." Physical Review A, 77(3), 033408 (2008).

Bloom, A. L., "Principles of operation of the rubidium vapor magnetometer." Applied Optics 1(1), 61-68 (1962).

Bell, W.E., and Bloom, A.L., "Optically driven spin precession." Physical Review Letters 6, (6), 280 (1961).

Roberts, G., Holmes, N., Alexander, N., Boto, E., Leggett, J., Hill, R.M., Shah, V., Rea, M., Vaughan, R., Maguire, E.A. and Kessler, K., "Towards OPM-MEG in a virtual reality environment." NeuroImage, 199, 408-417 (2019).

Zhang, R., Xiao, W., Ding, Y., Feng, Y., Peng, X., Shen, L., Sun, C., Wu, T., Wu, Y., Yang, Y. and Zheng, Z., "Recording brain activities in unshielded Earth's field with optically pumped atomic magnetometers." Science Advances, 6(24) (2020).

De Cheveigné, A., Wong, D.D., Di Liberto, G.M., Hjortkjaer, J., Slaney, M. and Lalor, E., "Decoding the auditory brain with canonical component analysis." NeuroImage, 172, 206-216 (2018).

Mellinger, J., Schalk, G., Braun, C., Preissl, H., Rosenstiel, W., Birbaumer, N. and Kübler, A., "An MEG-based brain-computer interface (BCI)." Neuroimage, 36(3), 581-593 (2007).

Wolpaw, J.R., McFarland, D.J., Neat, G.W. and Forneris, C.A., "An EEG-based brain-computer interface for cursor control." Electroencephalography and clinical neurophysiology, 78(3), 252-259 (1991).

Lightfoot, G., "Summary of the N1-P2 cortical auditory evoked potential to estimate the auditory threshold in adults". Seminars in hearing, 37(1), 1 (2016).

Virtanen, J., Ahveninen, J., Ilmoniemi, R. J., Näätänen, R., & Pekkonen, E., "Replicability of MEG and EEG measures of the auditory N1/N1m-response." Electroencephalography and Clinical Neurophysiology/Evoked Potentials Section, 108(3), 291-298 (1998).

Gascoyne, L., Furlong, P. L., Hillebrand, A., Worthen, S. F., & Witton, C., "Localising the auditory N1m with event-related beamform-

(56) References Cited

OTHER PUBLICATIONS ers: localisation accuracy following bilateral and unilateral stimulation." Scientific reports, 6(1), 1-9 (2016).

Borna, A., Carter, T.R., Goldberg, J.D., Colombo, A.P., Jau, Y.Y., Berry, C., McKay, J., Stephen, J., Weisend, M. and Schwindt, P.D., "A 20-channel magnetoencephalography system based on optically pumped magnetometers." Physics n Medicine & Biology, 62(23), 8909 (2017).

Pyragius, T., Marin Florez, H., & Fernholz, T. (2019). A Voigt effect based 3D vector magnetometer. Physical Review A, 100(2), https://doi.org/10.1103/PhysRevA.100.023416.

Rui Zhang, Rahul Mhaskar, Ken Smith, Easswar Balasubramaniam, Mark Prouty. "All Optical Scalar Atomic Magnetometer Capable of Vector Measurement," Submitted on Nov. 17, 2020. https://arxiv.org/abs/2011.08943; Geometrics, Inc., San Jose, CA, 95131, USA.

Arjen Stolk, Ana Todorovic, Jan-Mathijs Schoffelen, and Robert Oostenveld. "Online and offline tools for head movement compensation in MEG." Neuroimage 68 (2013): 39-48.

Bagherzadeh, Yasaman, Daniel Baldauf, Dimitrios Pantazis, and Robert Desimone. "Alpha synchrony and the neurofeedback control of spatial attention." Neuron 105, No. 3 (2020): 577-587.

Stephan Lau et al : "Optimal Magnetic Sensor Vests for Cardiac Source Imaging", SENSORS, vol. 16, No. 6, May 24, 2016 (May 24, 2016), p. 754.

Rodriguez Vince: "On the design of door-less access passages to shielded enclosures", 2017 Antenna Measurement Techniques Association Symposium (AMTA), AMTA, Oct. 15, 2017 (Oct. 15, 2017), pp. 1-6.

Orang Alem et al: "Fetal magnetocardiography measurements with an array of microfabricated optically pumped magnetometers", Physics in Medicine and Biology, Institute of Physics Publishing, Bristol GB, vol. 60, No. 12, Jun. 4, 2015 (Jun. 4, 2015), pp. 4797-4811.

Smit Mobile Equipment B.V.: "Mobile MRI", Dec. 19, 2016 (Dec. 19, 2016), Retrieved from the Internet: URL:https://web.archive.org/web/20161219022429/https://smit.one/products/mobile%20mri.html.

Zhang Xin et al: "Detection and analysis of MEG signals in occipital region with double-channel OPM sensors", Journal of Neuroscience Methods, Elsevier Science Publisher B. V., Amsterdam, NL, vol. 346, Sep. 17, 2020 (Sep. 17, 2020).

Hill RM, Boto E, Holmes N, et al. A tool for functional brain imaging with lifespan compliance [published correction appears in Nat Commun. Dec. 4, 2019;10(1):5628]. Nat Commun. 2019;10(1):4785. Published Nov. 5, 2019. doi:10.1038/s41467-019-12486-x.

Zetter, R., Iivanainen, J. & Parkkonen, L. Optical Co-registration of MRI and On-scalp MEG. Sci Rep 9, 5490 (2019). https://doi.org/10.1038/s41598-019-41763-4.

Garrido-Jurado, Sergio, Rafael Muñoz-Salinas, Francisco José Madrid-Cuevas and Manuel J. Marín-Jiménez. "Automatic generation and detection of highly reliable fiducial markers under occlusion." Pattern Recognit. 47 (2014): 2280-2292.

Hill RM, Boto E, Rea M, et al. Multi-channel whole-head OPM-MEG: Helmet design and a comparison with a conventional system [published online ahead of print, May 29, 2020]. Neuroimage. 2020;219:116995. doi:10.1016/j.neuroimage.2020.116995.

V. Kazemi and J. Sullivan, "One millisecond face alignment with an ensemble of regression trees," 2014 IEEE Conference on Computer Vision and Pattern Recognition, Columbus, OH, 2014, pp. 1867-1874, doi: 10.1109/CVPR.2014.241.

Holmes, N., Tierney, T.M., Leggett, J. et al. Balanced, bi-planar magnetic field and field gradient coils for field compensation in wearable magnetoencephalography. Sci Rep 9, 14196 (2019).

N. Holmes, J. Leggett, E. Boto, G. Roberts, R.M. Hill, T.M. Tierney, V. Shah, G.R. Barnes, M.J. Brookes, R. Bowtell A bi-planar coil system for nulling background magnetic fields in scalp mounted magnetoencephalography Neuroimage, 181 (2018), pp. 760-774.

J. M. Leger et al., In-flight performance of the Absolute Scalar Magnetometer vector mode on board the Swarm satellites, Earth, Planets, and Space (2015) 67:57.

Alexandrov, E. B., Balabas, M. V., Kulyasov, V. N., Ivanov, A. E., Pazgalev, A. S., Rasson, J. L., . . . (2004). Three-component variometer based on a scalar potassium sensor. Measurement Science and Technology, 15(5), 918-922.

Gravrand, O., Khokhlov, A., & JL, L. M. (2001). On the calibration of a vectorial 4He pumped magnetometer. Earth, planets and space, 53 (10), 949-958.

Borna, Amir & Carter, Tony & Colombo, Anthony & Jau, Y-Y & McKay, Jim & Weisend, Michael & Taulu, Samu & Stephen, Julia & Schwindt, Peter. (2018). Non-Invasive Functional-Brain-Imaging with a Novel Magnetoencephalography System. 9 Pages.

Vrba J, Robinson SE. Signal processing in magnetoencephalography. Methods. 2001;25(2):249-271. doi:10.1006/meth.2001.1238.

Uusitalo M and Ilmoniemi R., 1997, Signal-space projection method for separating MEG or EEG into components. Med. Biol. Comput. (35) 135-140.

Taulu S and Kajola M., 2005, Presentation of electromagnetic multichannel data: the signal space separation method. J. Appl. Phys. (97) 124905 (2005).

Taulu S, Simola J and Kajola M., 2005, Applications of the signal space separation method. IEEE Trans. Signal Process. (53) 3359-3372 (2005).

Taulu S, Simola J., 2006, Spatiotemporal signal space separation method for rejecting nearby interference in MEG measurements. Phys. Med. Biol. (51) 1759-1768 (2006).

Johnson, et al., Magnetoencephalography with a two-color pump-probe, fiber-coupled atomic magnetometer, Applied Physics Letters 97, 243703 2010.

Zhang, et al., Magnetoencephalography using a compact multichannel atomic magnetometer with pump-probe configuration, AIP Advances 8, 125028 (2018).

Xia, H. & Ben-Amar Baranga, Andrei & Hoffman, D. & Romalis, Michael. (2006). Magnetoencephalography with an atomic magnetometer. Applied Physics Letters—Appl Phys Lett. 89. 10.1063/1.2392722.

Ilmoniemi, R. (2009). The triangle phantom in magnetoencephalography. In 24th Annual Meeting of Japan Biomagnetism and Bioelecctromagnetics Society, Kanazawa, Japan, 28.29.5.2009 (pp. 6263).

Oyama D. Dry phantom for magnetoencephalography—Configuration, calibration, and contribution. J Neurosci Methods. 2015;251:24-36. doi: 0.1016/j.jneumeth.2015.05.004.

Chutani, R., Maurice, V., Passilly, N. et al. Laser light routing in an elongated micromachined vapor cell with diffraction gratings for atomic clock applications. Sci Rep 5, 14001 (2015). https://doi.org/10.1038/srep14001.

Eklund, E. Jesper, Andrei M. Shkel, Svenja Knappe, Elizabeth A. Donley and John Kitching. "Glass-blown spherical microcells for chip-scale atomic devices." (2008).

Jiménez-Martínez R, Kennedy DJ, Rosenbluh M, et al. Optical hyperpolarization and NMR detection of 129Xe on a microfluidic chip. Nat Commun. 2014;5:3908. Published May 20, 2014. doi:10.1038/ncomms4908.

Boto, Elena, Sofie S. Meyer, Vishal Shah, Orang Alem, Svenja Knappe, Peter Kruger, T. Mark Fromhold, et al. "A New Generation of Magnetoencephalography: Room Temperature Measurements Using Optically-Pumped Magnetometers." NeuroImage 149 (Apr. 1, 2017): 404-14.

Bruno, A. C., and P. Costa Ribeiro. "Spatial Fourier Calibration Method for Multichannel SQUID Magnetometers." Review of Scientific Instruments 62, No. 4 (Apr. 1, 1991): 1005-9.

Chella, Federico, Filippo Zappasodi, Laura Marzetti, Stefania Della Penna, and Vittorio Pizzella. "Calibration of a Multichannel MEG System Based on the Signal Space Separation Method." Physics in Medicine and Biology 57 (Jul. 13, 2012): 4855-70.

Pasquarelli, A, M De Melis, Laura Marzetti, Hans-Peter Müller, and S N Erné. "Calibration of a Vector-MEG Helmet System." Neurology & Clinical Neurophysiology□: NCN 2004 (Feb. 1, 2004): 94.

Pfeiffer, Christoph, Lau M. Andersen, Daniel Lundqvist, Matti Hämäläinen, Justin F. Schneiderman, and Robert Oostenveld. "Local- (56) References Cited

OTHER PUBLICATIONS izing On-Scalp MEG Sensors Using an Array of Magnetic Dipole Coils." PLOS One 13, No. 5 (May 10, 2018): e0191111.
Vivaldi, Valentina, Sara Sommariva, and Alberto Sorrentino. "A Simplex Method for the Calibration of a MEG Device." Communications in Applied and Industrial Mathematics 10 (Jan. 1, 2019): 35-46.
Nagel, S., & Spüler, M. (2019). Asynchronous non-invasive high-speed BCI speller with robust non-control state detection. Scientific Reports, 9(1), 8269.
Thielen, J., van den Broek, P., Farquhar, J., & Desain, P. (2015). Broad-Band Visually Evoked Potentials: Re(con) volution in Brain-Computer Interfacing. PloS One, 10(7), e0133797. https://doi.org/10.1371/journal.pone.0133797.
J. Kitching, "Chip-scale atomic devices," Appl. Phys. Rev. 5(3), 031302 (2018), 39 pages.
Allred, J. C., Lyman, R. N., Kornack, T. W., & Romalis, M. V. (2002). High-sensitivity atomic magnetometer unaffected by spin-exchange relaxation. Physical review letters, 89(13), 130801.
Balabas et al. Polarized alkali vapor with minute-long transverse spin-relaxation time, Phys. Rev. Lett. 105, 070801—Published Aug. 12, 2010.
Barbieri, F., Trauchessec, V., Caruso, L., Trejo-Rosillo, J., Telenczuk, B., Paul, E., . . . & Ouanounou, G. (2016). Local recording of biological magnetic fields using Giant Magneto Resistance-based micro-probes. Scientific reports, 6, 39330.
Dmitry Budker and Michael Romalis, "Optical Magnetometry," Nature Physics, 2008, https://arxiv.org/abs/physics/0611246v1.
Anthony P. Colombo, Tony R. Carter, Amir Borna, Yuan-Yu Jau, Cort N. Johnson, Amber L. Dagel, and Peter D. D. Schwindt, "Four-channel optically pumped atomic magnetometer for magnetoencephalography," Opt. Express 24, 15403-15416 (2016).
Dang, H.B. & Maloof, A.C. & Romalis, Michael. (2009). Ultra-high sensitivity magnetic field and magnetization measurements with an atomic magnetometer. Applied Physics Letters. 97. 10.1063/1.3491215.
Donley, E.A. & Hodby, E & Hollberg, L & Kitching, J. (2007). Demonstration of high-performance compact magnetic shields for chip-scale atomic devices. The Review of scientific instruments. 78. 083102.
Hämäläinen, Matti & Hari, Riitta & Ilmoniemi, Risto J. & Knuutila, Jukka & Lounasmaa, Olli V. Apr. 1993. Magnetoencephalograph—theory, instrumentation, and applications to noninvasive studies of the working human brain. Reviews of Modern Physics. vol. 65, Issue 2. 413-497.
Hunter, D. and Piccolomo, S. and Pritchard, J. D. and Brockie, N. L. and Dyer, T. E. and Riis, E. (2018) Free-induction-decay magnetometer based on a microfabricated Cs vapor cell. Physical Review Applied (10).ISSN 2331-7019.
Jiménez-Martínez, R., Griffith, W. C., Wang, Y. J., Knappe, S., Kitching, J., Smith, K., & Prouty, M. D. (2010). Sensitivity comparison of Mx and frequency-modulated bell-bloom Cs magnetometers in a microfabricated cell. IEEE Transactions on Instrumentation and Measurement, 59(2), 372-378.
Kiwoong Kim, Samo Begus, Hui Xia, Seung-Kyun Lee, Vojko Jazbinsek, Zvonko Trontelj, Michael V. Romalis, Multi-channel atomic magnetometer for magnetoencephalography: A configuration study. NeuroImage 89 (2014) 143-151 http://physics.princeton.edu/romalis/papers/Kim_2014.pdf.
Knappe, Svenja & Sander, Tilmann & Trahms, Lutz. (2012). Optically-Pumped Magnetometers for MEG. Magnetoencephalography: From Signals to Dynamic Cortical Networks. 993-999. 10.1007/978-3-642-33045-2_49.
Kominis, I.K., Kornack, T.W., Allred, J.C. and Romalis, M.V., 2003. A subfemtotesla multichannel atomic magnetometer. Nature, 422(6932), p. 596.
Korth, H., K. Strohbehn, F. Tejada, A. G. Andreou, J. Kitching, S. Knappe, S. J. Lehtonen, S. M. London, and M. Kafel (2016), Miniature atomic scalarmagnetometer for space based on the rubidium isotope 87Rb, J. Geophys. Res. Space Physics, 121, 7870-7880, doi: 10.1002/2016JA022389.
Lenz, J. and Edelstein, S., 2006. Magnetic sensors and their applications. IEEE Sensors journal, 6(3), pp. 631-649.
Li, S & Vachaspati, Pranjal & Sheng, Dehong & Dural, Nezih & Romalis, Michael. (2011). Optical rotation in excess of 100 rad generated by Rb vapor in a multipass cell. Phys. Rev. A. 84. 10.1103/PhysRevA.84.061403.
Maze, J. R., Stanwix, P. L., Hodges, J. S., Hong, S., Taylor, J. M., Cappellaro, P., . . . & Yacoby, A. (2008). Nanoscale magnetic sensing with an individual electronic spin in diamond. Nature, 455(7213), 644.
Sander TH, Preusser J, Mhaskar R, Kitching J, Trahms L, Knappe S. Magnetoencephalography with a chip-scale atomic magnetometer. Biomed Opt Express. 2012;3(5):981-90.
J. Seltzer, S & Romalis, Michael. (2010). High-temperature alkali vapor cells with antirelaxation surface coatings. Journal of Applied Physics. 106. 114905-114905. 10.1063/1.3236649.
Seltzer, S. J., and Romalis, M.V., "Unshielded three-axis vector operation of a spin-exchange-relaxation-free atomic magnetometer." Applied physics letters 85.20 (2004): 4804-4806.
Sheng, Dong & R. Perry, Abigail & Krzyzewski, Sean & Geller, Shawn & Kitching, John & Knappe, Svenja. (2017). A microfabricated optically-pumped magnetic gradiometer. Applied Physics Letters. 110. 10.1063/1.4974349.
Sheng, Dehong & Li, S & Dural, Nezih & Romalis, Michael. (2013). Subfemtotesla Scalar Atomic Magnetometry Using Multipass Cells. Physical review letters. 110. 160802. 10.1103/PhysRevLett.110.160802.
Volkmar Schultze et al. An Optically Pumped Magnetometer Working in the Light-Shift Dispersed Mz Mode, Sensors 2017, 17, 561; doi:10.3390/s17030561.
Fang, J. and Qin, J., 2012. In situ triaxial magnetic field compensation for the spin-exchange-relaxation-free atomic magnetometer. Review of Scientific Instruments, 83(10), p. 103104.
Joon Lee, Hyun & Shim, Jeong & Moon, Han Seb & Kim, Kiwoong. (2014). Flat-response spin-exchange relaxation free atomic magnetometer under negative feedback. Optics Express. 22. 10.1364/OE.22.019887.
Griffith, Clark & Jimenez-Martinez, Ricardo & Shah, Vishal & Knappe, Svenja & Kitching, John. (2009). Miniature atomic magnetometer integrated with flux concentrators. Applied Physics Letters—Appl Phys Lett. 94. 10.1063/1.3056152.
Lee, S.-K & Romalis, Michael. (2008). Calculation of Magnetic Field Noise from High-Permeability Magnetic Shields and Conducting Objects with Simple Geometry. Journal of Applied Physics. 103. 084904-084904. 10.1063/1.2885711.
Vovrosh, Jamie & Voulazeris, Georgios & Petrov, Plamen & Zou, Ji & Gaber Beshay, Youssef & Benn, Laura & Woolger, David & Attallah, Moataz & Boyer, Vincent & Bongs, Kai & Holynski, Michael. (2018). Additive manufacturing of magnetic shielding and ultra-high vacuum flange for cold atom sensors. Scientific Reports. 8. 10.1038/s41598-018-20352-x.
Kim, Young Jin & Savukov, I. (2016). Ultra-sensitive Magnetic Microscopy with an Optically Pumped Magnetometer. Scientific Reports. 6. 24773. 10.1038/srep24773.
Navau, Carles & Prat-Camps, Jordi & Sanchez, Alvaro. (2012). Magnetic Energy Harvesting and Concentration at a Distance by Transformation Optics. Physical review letters. 109. 263903. 10.1103/PhysRevLett.109.263903.
Orang Alem, Rahul Mhaskar, Ricardo Jimenez-Martinez, Dong Sheng, John LeBlanc, Lutz Trahms, Tilmann Sander, John Kitching, and Svenja Knappe, "Magnetic field imaging with microfabricated optically-pumped magnetometers," Opt. Express 25, 7849-7858 (2017).
Slocum et al., Self-Calibrating Vector Magnetometer for Space, https://esto.nasa.gov/conferences/estc-2002/Papers/B3P4(Slocum).pdf.
Dupont-Roc, J & Haroche, S & Cohen-Tannoudji, C. (1969). Detection of very weak magnetic fields (10-9gauss) by 87Rb zero-field level crossing resonances. Physics Letters A—Phys Lett A. 28. 638-639. 10.1016/0375-9601(69)90480-0.

(56) References Cited

OTHER PUBLICATIONS

J. A. Neuman, P. Wang, and A. Gallagher, Robust high-temperature sapphire cell for metal vapors, Review of Scientific Instruments, vol. 66, Issue 4, Apr. 1995, pp. 3021-3023.

Borna, Amir, et al. "A 20-channel magnetoencephalography system based on optically pumped magnetometers." Physics in Medicine & Biology 62.23 (2017): 8909.

R. E. Slocum & L. J. Ryan, Design and operation of the minature vector laser magnetometer, Nasa Earth Science Technology Conference 2003.

Schoenmaker, Jeroen & R Pirota, K & Teixeira, Julio. (2013). Magnetic flux amplification by Lenz lenses. The Review of scientific instruments. 84. 085120. 10.1063/1.4819234.

Hu, Yanhui & Hu, Zhaohui & Liu, Xuejing & Li, Yang & Zhang, Ji & Yao, Han & Ding, Ming. (2017). Reduction of far off-resonance laser frequency drifts based on the second harmonic of electro-optic modulator detection in the optically pumped magnetometer. Applied Optics. 56. 5927. 10.1364/AO.56.005927.

Masuda, Y & Ino, T & Skoy, Vadim & Jones, G.L. (2005). 3He polarization via optical pumping in a birefringent cell. Applied Physics Letters. 87. 10.1063/1.2008370.

A.B. Baranga et al., An atomic magnetometer for brain activity imaging, Real Time Conference 2005. 14th IEEE-NPSS. pp. 417-418.

Larry J. Ryan, Robert E. Slocum, and Robert B. Steves, Miniature Vector Laser Magnetometer Measurements of Earth's Field, May 10, 2004, 4 pgs.

Lorenz, V. O., Dai, X., Green, H., Asnicar, T. R., & Cundiff, S. T. (2008). High-density, high-temperature alkali vapor cell. Review of Scientific Instruments, 79(12), 4 pages.

F. Jackson Kimball, D & Dudley, J & Li, Y & Thulasi, Swecha & Pustelny, Szymon & Budker, Dmitry & Zolotorev, Max. (2016). Magnetic shielding and exotic spin-dependent interactions. Physical Review D. 94. 10.1103/PhysRevD.94.082005.

Huang, Haichao, et al. "Single-beam three-axis atomic magnetometer." Applied Physics Letters 109.6 (2016): 062404. (Year: 2016).

Scott Jeffrey Seltzer: "Developments in alkali-metal atomic magnetometry", Nov. 1, 2008 (Nov. 1, 2008), XP055616618, ISBN: 978-0-549-93355-7 Retrieved from the Internet: URL:http://physics.princeton.edu/atomic/romalis/papers/Seltzer%20Thesis.pdf [retrieved on Aug. 29, 2019] pp. 148-159.

Haifeng Dong et al: "Atomic-Signal-Based Zero-Field Finding Technique for Unshielded Atomic Vector Magnetometer", IEEE Sensors Journal, IEEE Service Center, New York, NY, US, vol. 13, No. 1, Jan. 1, 2013 (Jan. 1, 2013), pp. 186-189.

Boto, E, Holmes, N, Leggett, J, Roberts, G, Shah, V, Meyer, SS, Muñoz, LD, Mullinger, KJ, Tierney, TM, Bestmann, S, Barnes, GR, Bowtell, R & Brookes, MJ 2018, 'Moving magnetoencephalography towards real world applications with a wearable system', Nature, vol. 555, pp. 657-661.

Ijsselsteijn, R & Kielpinski, Mark & Woetzel, S & Scholtes, Theo & Kessler, Ernst & Stolz, Ronny & Schultze, V & Meyer, H-G. (2012). A full optically operated magnetometer array: An experimental study. The Review of scientific instruments. 83. 113106. 10.1063/1.4766961.

Tierney, T. M., Holmes, N., Meyer, S. S., Boto, E., Roberts, G., Leggett, J., . . . Barnes, G. R. (2018). Cognitive neuroscience using wearable magnetometer arrays: Non-invasive assessment of language function. NeuroImage, 181, 513-520.

Manon Kok, Jeroen D. Hol and Thomas B. Schon (2017), "Using Inertial Sensors for Position and Orientation Estimation", Foundations and Trends in Signal Processing: vol. 11: No. 1-2, pp. 1-153. http://dx.doi.org/10.1561/2000000094.

\* cited by examiner

DEVICES, SYSTEMS, AND METHODS WITH A PIEZOELECTRIC-DRIVEN LIGHT INTENSITY MODULATOR

CROSS-REFERENCE TO RELATED APPLICATIONS

This application claims the benefit of U.S. Provisional Patent Application Ser. No. 63/136,415, filed Jan. 12, 2021, and U.S. Provisional Patent Application Ser. No. 63/189,870, filed May 18, 2021, both of which are incorporated herein by reference in their entireties.

FIELD

The present disclosure is directed to piezoelectric-driven light intensity monitors that can be used in magnetic field measurement systems and other applications. The present disclosure is also directed to the area of magnetic field measurement systems including systems for magnetoencephalography (MEG).

BACKGROUND

In the nervous system, neurons propagate signals via action potentials. These are brief electric currents which flow down the length of a neuron causing chemical transmitters to be released at a synapse. The time-varying electrical currents within an ensemble of neurons generate a magnetic field. Magnetoencephalography (MEG), the measurement of magnetic fields generated by the brain, is one method for observing these neural signals.

Existing systems for observing or measuring MEG typically utilize superconducting quantum interference devices (SQUIDs) or collections of discrete optically pumped magnetometers (OPMs). SQUIDs require cryogenic cooling which is bulky and expensive and requires a lot of maintenance which preclude their use in mobile or wearable devices.

OPMs utilize light from a light source. Often the light is delivered from the light source using a fiber-optic arrangement. The intensity of the light delivered by the fiber-optic arrangement can vary for a variety of reasons including, but not limited to, fluctuations by the light source. Arrangements for achieving intensity control in fiber-optic arrangements often involve one or more of the following: deflection of light via devices, such as MEMs mirrors; electro-optic effects to rotate optical polarization in crystals; or diffraction of light by acousto-optic modulators. Although these techniques are effective, commercially available devices are often not cost effective at scale. In the case of MEMs mirrors, elevated noise also is frequently observed.

BRIEF SUMMARY

One embodiment is a light intensity modulator that includes an input optical fiber; an output optical fiber; an optical arrangement having a lens, where the optical arrangement is configured to receive light from the input optical fiber, pass the light through the lens, and direct the light to the output optical fiber; and a piezoelectric device coupled to the lens, where the piezoelectric device is configured for moving the lens to alter overlap of the output optical fiber and the light directed to the output optical fiber to modulate intensity of light in the output optical fiber.

In at least some embodiments, the lens is a GRIN lens. In at least some embodiments, the piezoelectric device is configured to move the lens in a direction transverse to an optical axis of a distal portion of the input optical fiber. In at least some embodiments, the piezoelectric device is configured to move the lens in a direction parallel to an optical axis of a distal portion of the input optical fiber. In at least some embodiments, the piezoelectric device is configured to move the lens in a direction transverse to an optical axis of a distal portion of the input optical fiber and configured to move the lens in a direction parallel to an optical axis of a distal portion of the input optical fiber.

In at least some embodiments, the optical arrangement further includes a mirror or mirrored surface positioned to receive light from the lens and reflect the light back through the lens. In at least some embodiments, the light intensity modulator further includes a detector configured to receive a portion of the light in the output optical fiber and produce a monitor signal; and a controller coupled to the detector and the piezoelectric device and configured to use the monitor signal to operate the piezoelectric device to modulate the intensity of the light in the output optical fiber. In at least some embodiments, the lens is disposed between the input optical fiber and the output optical fiber.

Another embodiment is a method for modulation light intensity. The method includes directing light into the input optical fiber of any of the light intensity modulators described above; transmitting the light through the optical arrangement and into the output optical fiber; and operating the piezoelectric device to move the lens to maintain an intensity of light in the output optical fiber within a selected range.

In at least some embodiments, operating the piezoelectric device includes operating the piezoelectric device to move the lens in a direction transverse to an optical axis of a distal portion of the input optical fiber. In at least some embodiments, operating the piezoelectric device includes operating the piezoelectric device to move the lens in a direction parallel to an optical axis of a distal portion of the input optical fiber.

A further embodiment is a light intensity modulator that includes an input optical fiber; an output optical fiber; and a piezoelectric device coupled to either the input optical fiber or the output optical fiber, where the piezoelectric device is configured for moving the input optical fiber or the output optical fiber to alter overlap of the output optical fiber and the light emitted by the input optical fiber to modulate intensity of light in the output optical fiber.

In at least some embodiments, the piezoelectric device is configured to move the input optical fiber or the output optical fiber in a direction transverse to an optical axis of a distal portion of the input optical fiber. In at least some embodiments, the piezoelectric device is configured to move the input optical fiber or the output optical fiber in a direction parallel to an optical axis of a distal portion of the input optical fiber.

In at least some embodiments, the light intensity modulator further includes a detector configured to receive a portion of the light in the output optical fiber and produce a monitor signal; and a controller coupled to the detector and the piezoelectric device and configured to use the monitor signal to operate the piezoelectric device to modulate the intensity of the light in the output optical fiber.

Yet another embodiment is a method for modulation light intensity. The method includes directing light into the input optical fiber of any of the light intensity modulators described above; transmitting the light into the output optical fiber; and operating the piezoelectric device to move the lens to maintain an intensity of light in the output optical fiber within a selected range.

Another embodiment is an optically pumped magnetometer that includes at least one light source; a vapor cell; and any of the light intensity modulators described above disposed between the at least one light source and the vapor cell, where the input optical fiber is configured to receive light emitted by the at least one light source and the output optical fiber is configured to transmit light for illumination of the vapor cell.

A further embodiment is a magnetic field measurement system that includes the optically pumped magnetometer described above; and a detector configured to measure light transmitted through the vapor cell.

BRIEF DESCRIPTION OF THE DRAWINGS

Non-limiting and non-exhaustive embodiments of the present invention are described with reference to the following drawings. In the drawings, like reference numerals refer to like parts throughout the various figures unless otherwise specified.

For a better understanding of the present invention, reference will be made to the following Detailed Description, which is to be read in association with the accompanying drawings, wherein.

DETAILED DESCRIPTION

The present disclosure is directed to piezoelectric-driven light intensity monitors that can be used in magnetic field measurement systems and other applications. The present disclosure is also directed to the area of magnetic field measurement systems including systems for magnetoencephalography (MEG).

Although the present disclosure utilizes magnetoencephalography (MEG) to exemplify the light intensity modulators, systems, and methods described herein, it will be understood that the light intensity modulators, systems, and methods can be used in any other suitable application.

Herein the terms "ambient background magnetic field" and "background magnetic field" are interchangeable and used to identify the magnetic field or fields associated with sources other than the magnetic field measurement system and the magnetic field sources of interest, such as biological source(s) (for example, neural signals from a user's brain) or non-biological source(s) of interest. The terms can include, for example, the Earth's magnetic field, as well as magnetic fields from magnets, electromagnets, electrical devices, and other signal or field generators in the environment, except for the magnetic field generator(s) that are part of the magnetic field measurement system.

The terms "gas cell", "vapor cell", and "vapor gas cell" are used interchangeably herein. Below, a gas cell containing alkali metal vapor is described, but it will be recognized that other gas cells can contain different gases or vapors for operation.

An optically pumped magnetometer (OPM) is a basic component used in optical magnetometry to measure magnetic fields. While there are many types of OPMs, in general magnetometers operate in two modalities: vector mode and scalar mode. In vector mode, the OPM can measure one, two, or all three vector components of the magnetic field; while in scalar mode the OPM can measure the total magnitude of the magnetic field.

Vector mode magnetometers measure a specific component of the magnetic field, such as the radial and tangential components of magnetic fields with respect the scalp of the human head. Vector mode OPMs often operate at zero-field and may utilize a spin exchange relaxation free (SERF) mode to reach femto-Tesla sensitivities. A SERF mode OPM is one example of a vector mode OPM, but other vector mode OPMs can be used at higher magnetic fields. These SERF mode magnetometers can have high sensitivity but may not function in the presence of magnetic fields higher than the linewidth of the magnetic resonance of the atoms of about 10 nT, which is much smaller than the magnetic field strength generated by the Earth. As a result, conventional SERF mode magnetometers often operate inside magnetically shielded rooms that isolate the sensor from ambient magnetic fields including Earth's magnetic field.

Magnetometers operating in the scalar mode can measure the total magnitude of the magnetic field. (Magnetometers in the vector mode can also be used for magnitude measurements.) Scalar mode OPMs often have lower sensitivity than SERF mode OPMs and are capable of operating in higher magnetic field environments.

The magnetic field measurement systems described herein can be used to measure or observe electromagnetic signals generated by one or more magnetic field sources (for example, neural signals or other biological sources) of interest. The system can measure biologically generated magnetic fields and, at least in some embodiments, can measure biologically generated magnetic fields in an unshielded or partially shielded environment. Aspects of a magnetic field measurement system will be exemplified below using magnetic signals from the brain of a user; however, biological signals from other areas of the body, as well as non-biological signals, can be measured using the system. This technology can also be applicable for uses outside biomedical sensing. In at least some embodiments, the system can be a wearable MEG system that can be used outside a magnetically shielded room. Examples of wearable MEG systems are described in U.S. Pat. No. 10,983,177 and U.S. Provisional Patent Application Ser. Nos. 63/031,469; 63/076,015; and 63/170,892, all of which are incorporated herein by reference in their entireties.

Figure 1A:
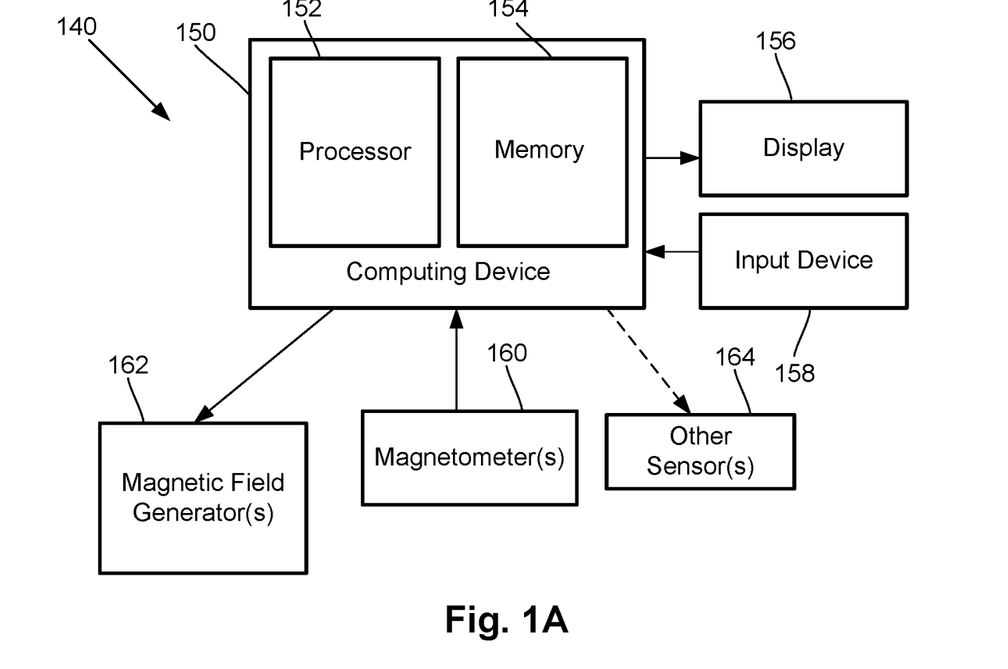
FIG. 1A is a schematic block diagram of one embodiment of a magnetic field measurement system, according to the invention.

A magnetic field measurement system can utilize one or more magnetic field sensors. Magnetometers will be used herein as an example of magnetic field sensors, but other magnetic field sensors may also be used. FIG. 1A is a block diagram of components of one embodiment of a magnetic field measurement system 140. The system 140 can include a computing device 150 or any other similar device that includes a processor 152, a memory 154, a display 156, an input device 158, one or more magnetometers 160 (for example, an array of magnetometers) which can be OPMs, one or more magnetic field generators 162, and, optionally, one or more other sensors 164 (e.g., non-magnetic field sensors). The system 140 and its use and operation will be described herein with respect to the measurement of neural signals arising from one or more magnetic field sources of interest in the brain of a user as an example. It will be understood, however, that the system can be adapted and used to measure signals from other magnetic field sources of interest including, but not limited to, other neural signals, other biological signals, as well as non-biological signals.

The computing device 150 can be a computer, tablet, mobile device, field programmable gate array (FPGA), microcontroller, or any other suitable device for processing information or instructions. The computing device 150 can be local to the user or can include components that are non-local to the user including one or both of the processor 152 or memory 154 (or portions thereof). For example, in at least some embodiments, the user may operate a terminal that is connected to a non-local computing device. In other embodiments, the memory 154 can be non-local to the user.

The computing device 150 can utilize any suitable processor 152 including one or more hardware processors that may be local to the user or non-local to the user or other components of the computing device.

Any suitable memory 154 can be used for the computing device 150. The memory 154 illustrates a type of computer-readable media, namely computer-readable storage media. Computer-readable storage media may include, but is not limited to, volatile, nonvolatile, non-transitory, removable, and non-removable media implemented in any method or technology for storage of information, such as computer readable instructions, data structures, program modules, or other data. Examples of computer-readable storage media include RAM, ROM, EEPROM, flash memory, or other memory technology, CD-ROM, digital versatile disks ("DVD") or other optical storage, magnetic cassettes, magnetic tape, magnetic disk storage or other magnetic storage devices, or any other medium which can be used to store the desired information and which can be accessed by a computing device.

Communication methods provide another type of computer readable media; namely communication media. Communication media typically embodies computer-readable instructions, data structures, program modules, or other data in a modulated data signal such as a carrier wave, data signal, or other transport mechanism and include any information delivery media. The terms "modulated data signal," and "carrier-wave signal" includes a signal that has one or more of its characteristics set or changed in such a manner as to encode information, instructions, data, and the like, in the signal. By way of example, communication media includes wired media such as twisted pair, coaxial cable, fiber optics, wave guides, and other wired media and wireless media such as acoustic, RF, infrared, and other wireless media.

The display 156 can be any suitable display device, such as a monitor, screen, or the like, and can include a printer. In some embodiments, the display is optional. In some embodiments, the display 156 may be integrated into a single unit with the computing device 150, such as a tablet, smart phone, or smart watch. In at least some embodiments, the display is not local to the user. The input device 158 can be, for example, a keyboard, mouse, touch screen, track ball, joystick, voice recognition system, or any combination thereof, or the like. In at least some embodiments, the input device is not local to the user.

The magnetic field generator(s) 162 can be, for example, Helmholtz coils, solenoid coils, planar coils, saddle coils, electromagnets, permanent magnets, or any other suitable arrangement for generating a magnetic field. As an example, the magnetic field generator 162 can include three orthogonal sets of coils to generate magnetic fields along three orthogonal axes. Other coil arrangements can also be used. The optional sensor(s) 164 can include, but are not limited to, one or more position sensors, orientation sensors, accelerometers, image recorders, or the like or any combination thereof.

The one or more magnetometers 160 can be any suitable magnetometer including, but not limited to, any suitable optically pumped magnetometer. Arrays of magnetometers are described in more detail herein. In at least some embodiments, at least one of the one or more magnetometers (or all of the magnetometers) of the system is arranged for operation in the SERF mode. Examples of magnetic field measurement systems, such as MEG systems, or methods of making such systems or components for such systems are described in U.S. Pat. Nos. 10,627,460; 10,976,386; 10,983, 177; 10,996,293; 11,022,658; 11,131,729 and 11,136,647; U.S. Patent Application Publications Nos. 2020/0057116; 2019/0391213; 2020/0088811; 2020/0109481; 2020/ 0123416; 2020/0191883; 2020/0241094; 2020/0309873; 2020/0334559; 2020/0341081; 2020/0381128; US 2021/ 0011094; 2021/0015385; 2021/0041512; 2021/0063510; 2021/0139742; 2021/0369165; 2021/0373092; 2021/ 0369201; and 2021/0369166; U.S. patent application Ser. No. 17/338,429; and U.S. Provisional Patent Application Ser. Nos. 62/689,696; 62/699,596; 62/719,471; 62/719,475; 62/719,928; 62/723,933; 62/732,327; 62/732,791; 62/741, 777; 62/743,343; 62/747,924; 62/745,144; 62/752,067; 62/776,895; 62/781,418; 62/796,958; 62/798,209; 62/798, 330; 62/804,539; 62/826,045; 62/827,390; 62/836,421; 62/837,574; 62/837,587; 62/842,818; 62/855,820; 62/858, 636; 62/860,001; 62/865,049; 62/873,694; 62/874,887; 62/883,399; 62/883,406; 62/888,858; 62/895,197; 62/896, 929; 62/898,461; 62/910,248; 62/913,000; 62/926,032; 62/926,043; 62/933,085; 62/960,548; 62/971,132; 62/983, 406; 63/031,469; 63/052,327; 63/076,015; 63/076,880; 63/080,248; 63/089,456; 63/135,364; 63/136,093; 63/136, 415; 63/140,150; 63/158,700; 63/159,823; 63/170,892; 63/189,870; 63/224,768; and 63/257,491, all of which are incorporated herein by reference in their entireties. The OPMs, OPM modules, and other system components described in these references can be used in the MEG and other magnetic field measurement systems and methods described herein.

Figure 1B:
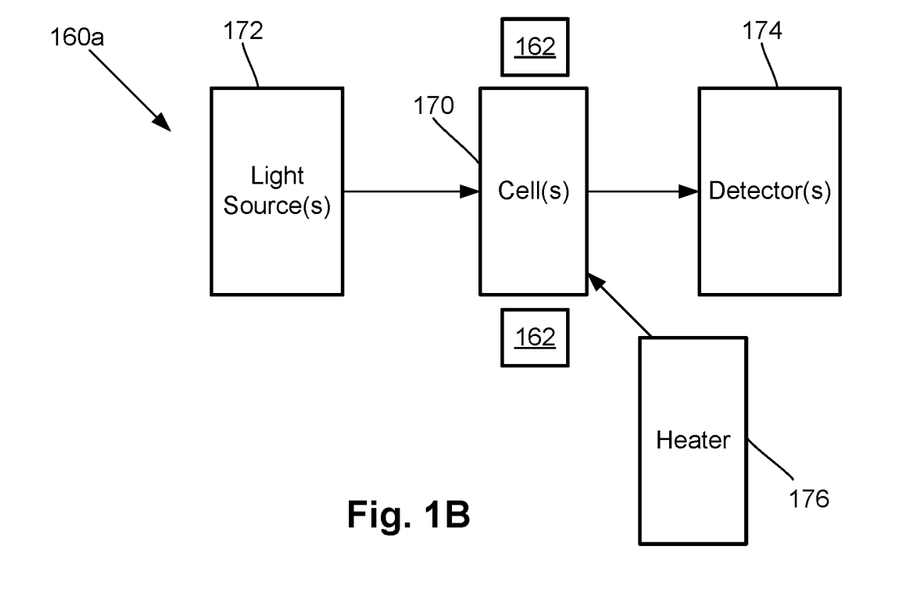
FIG. 1B is a schematic block diagram of one embodiment of a magnetometer, such as an OPM module, according to the invention.

FIG. 1B is a schematic block diagram of one embodiment of a magnetometer, such as an OPM module 160*a*, which includes one or more vapor cells 170 (also referred to as "cells") such as alkali metal vapor cells; a heating device 176 to heat the vapor cell(s) 170; one or more light sources 172 (which can include multiple different light sources, such as a pump light source and a probe light source); and one or more detectors 174. In addition, coils of a magnetic field generator 162 can be positioned around the vapor cell(s) 170. The vapor cell(s) 170 can include, for example, an alkali metal vapor (for example, rubidium in natural abundance, isotopically enriched rubidium, potassium, or cesium, or any other suitable alkali metal such as lithium, sodium, or francium) and, optionally, one, or both, of a quenching gas (for example, nitrogen) and a buffer gas (for example, nitrogen, helium, neon, or argon). In some embodiments, the vapor cell may include the alkali metal atoms in a prevaporized form prior to heating to generate the vapor.

The light source(s) 172 can each include, for example, a laser to, respectively, optically pump the alkali metal atoms and probe the vapor cell. The light source(s) 172 may also include optics (such as lenses, waveplates, collimators, polarizers, and objects with reflective surfaces) for beam shaping and polarization control and for directing the light from the light source to the cell and detector. Examples of suitable light sources include, but are not limited to, a diode laser (such as a vertical-cavity surface-emitting laser (VC-SEL), distributed Bragg reflector laser (DBR), distributed feedback laser (DFB)), external cavity diode laser (ECDL), light-emitting diode (LED), lamp, or any other suitable light source. In at least some embodiments, light can be delivered to the vapor cell via free-space optics or through a fiber optic arrangement with optical fibers.

The detector(s) 174 can include, for example, an optical detector to measure the optical properties of the transmitted probe light field amplitude, phase, or polarization, as quantified through optical absorption and dispersion curves, spectrum, or polarization or the like or any combination thereof. Examples of suitable detectors include, but are not limited to, a photodiode, charge coupled device (CCD) array, CMOS array, camera, photodiode array, single photon avalanche diode (SPAD) array, avalanche photodiode (APD) array, or any other suitable optical sensor array that can measure the change in transmitted light at the optical wavelengths of interest.

Figure 2:
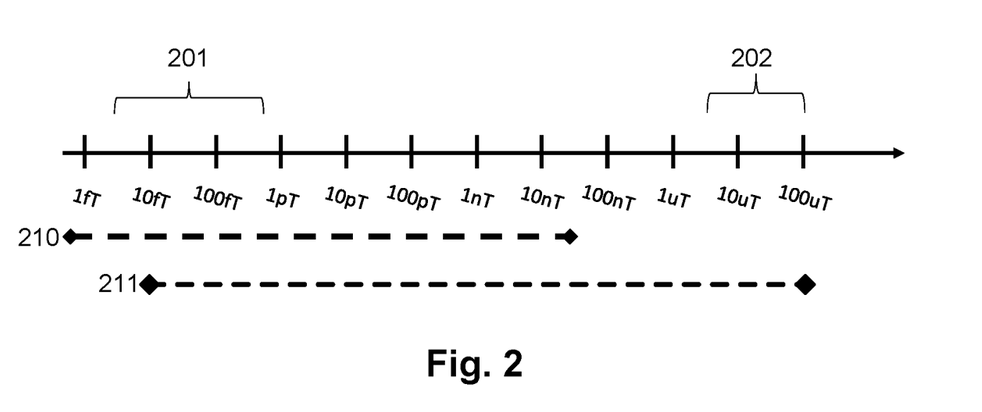
FIG. 2 shows a magnetic spectrum with lines indicating dynamic ranges of magnetometers operating in different modes.

FIG. 2 shows the magnetic spectrum from 1 fT to 100 µT in magnetic field strength on a logarithmic scale. The magnitude of magnetic fields generated by the human brain are indicated by range 201 and the magnitude of the background ambient magnetic field, including the Earth's magnetic field, by range 202. The strength of the Earth's magnetic field covers a range as it depends on the position on the Earth as well as the materials of the surrounding environment where the magnetic field is measured. Range 210 indicates the approximate measurement range of a magnetometer (e.g., an OPM) operating in the SERF mode (e.g., a SERF magnetometer) and range 211 indicates the approximate measurement range of a magnetometer operating in a scalar mode (e.g., a scalar magnetometer.) Typically, a SERF magnetometer is more sensitive than a scalar magnetometer, but many conventional SERF magnetometers typically only operate up to about 0 to 200 nT while the scalar magnetometer starts in the 10 to 100 fT range but extends above 10 to 100 µT.

As illustrated in FIG. 1B, the light source(s) 172 provides light for illumination of the vapor cell(s) 170. In at least some embodiments, the light intensity of a light source, such as a laser diode, can fluctuate. Such fluctuation can reduce the accuracy of the magnetic field measurement. Light intensity modulators for light intensity control in a fiber optic delivery system are disclosed herein. The light intensity modulator and fiber optic delivery system can be disposed between the light source(s) 172 and the vapor cell(s) 170. The light intensity modulators use piezoelectric devices (for example, piezoelectric chips or stages). In at least some embodiments, a light intensity modulators provides control of light intensity by modulating the position of a lens or fiber tip using a piezoelectric device.

Figure 3:
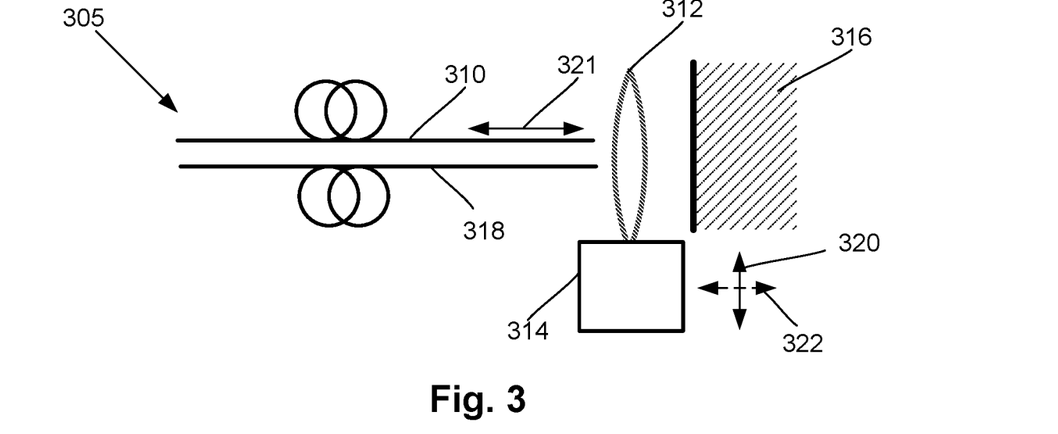
FIG. 3 shows a schematic illustration of one embodiment of a light intensity modulator, according to the invention.

One embodiment of a light intensity modulator 305 is illustrated in FIG. 3. Light, originating from the light source(s) 172 (FIG. 1B), is transmitted by an input optical fiber 310 and exits the input optical fiber to be collimated by a lens 312 of an optical arrangement. The lens 312 is mounted or otherwise coupled to a piezoelectric device 314 (such as a piezoelectric stage.) The light beam is reflected by a mirrored surface 316 (or other mirror or reflector) of the optical arrangement behind the lens 312. The reflected light beam is directed to an output optical fiber 318. For example, the reflected light beam can be focused to a spot at a tip or end of the output optical fiber 318.

Operation of the piezoelectric device 314 can move the lens 312 to steer the reflected light beam relative to the output optical fiber 318. The amount of light coupled into the output optical fiber 318 depends on the overlap of the reflected light beam with the core of the output optical fiber, thereby enabling control of the intensity of the light injected into the output optical fiber by changing the position of the lens 312 using the piezoelectric device 314. In at least some embodiments, the piezoelectric device 314 and lens 312 can be used to change the position of the focus of the reflected light beam relative to the output optical fiber 318.

In at least some embodiments, application of a voltage to (or other operation of) the piezoelectric device 314 translates or moves the lens 312 in a direction 320 transverse (e.g., up or down in FIG. 3) to an optical axis 321 of the distal portion of the input optical fiber 310. In at least some embodiments, the piezoelectric device 314 only translates or moves the lens in the transverse direction 320. In at least some embodiments, operation of the piezoelectric device 314 can translate or move the lens 312 in a direction 322 parallel to the optical axis 321 of the distal portion of the input optical fiber 310. In at least some embodiments, the piezoelectric device 314 only translates or moves the lens in the parallel direction 320 or only in either the parallel direction or the transverse direction. In at least some embodiments, operation of the piezoelectric device 314 can translate or move the lens 312 in a direction that is neither transverse, nor parallel (or is a combination of transverse and parallel) to the optical axis 321 of the distal portion of the input optical fiber 310.

Figure 9:
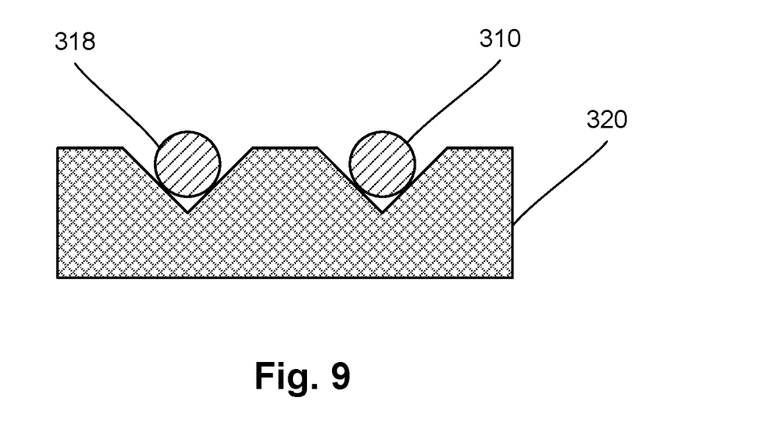
FIG. 9 is a cross-sectional view of an input optical fiber and an output optical fiber in a V-groove substrate, according to the invention.

The input optical fiber 310 and output optical fiber 312 can be provided in any suitable arrangement including adjacent to each other. In at least some embodiments, a V-groove substrate 320 can accommodate the input optical fiber 310 and output optical fiber 312, as illustrated in FIG. 9.

Figure 4:
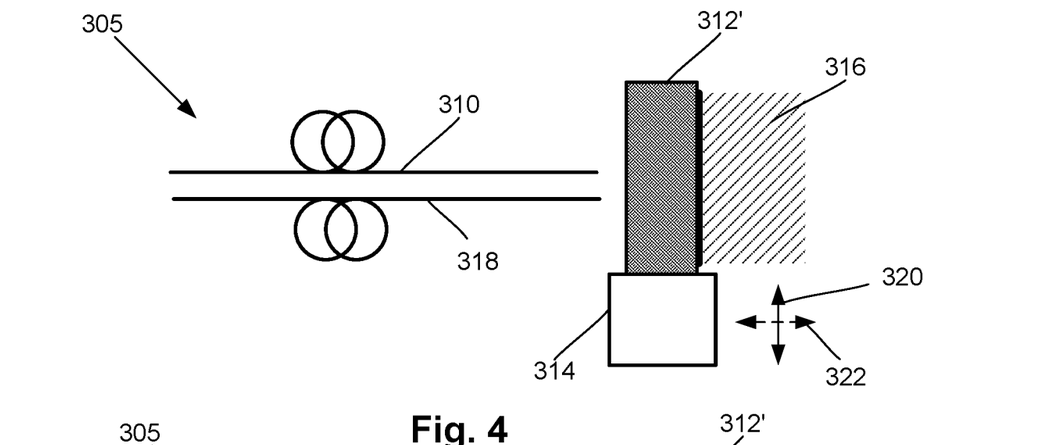
FIG. 4 shows a schematic illustration of a second embodiment of a light intensity modulator, according to the invention.

Another embodiment of a piezoelectric-driven light intensity modulator 305 is illustrated in FIG. 4. Light from the input optical fiber 310 is directed to a GRIN (gradient-index) lens 312' with an integrated mirrored surface 316 (or other mirror or reflector) at the back face of the GRIN lens. The GRIN lens 312' is mounted or otherwise coupled to the piezoelectric device 314. Operation of the piezoelectric device 314 translates or moves the GRIN lens 312 to steer the reflected light beam relative to the output optical fiber 318. The options for the direction of translation/movement described above for the embodiment illustrated in FIG. 3 are also applicable to this embodiment and all of the other embodiments described herein unless indicated otherwise.

This embodiment of the light intensity modulator 305 may be advantageous from a device fabrication perspective due to the lower number of discrete elements for alignment.

Figure 5:
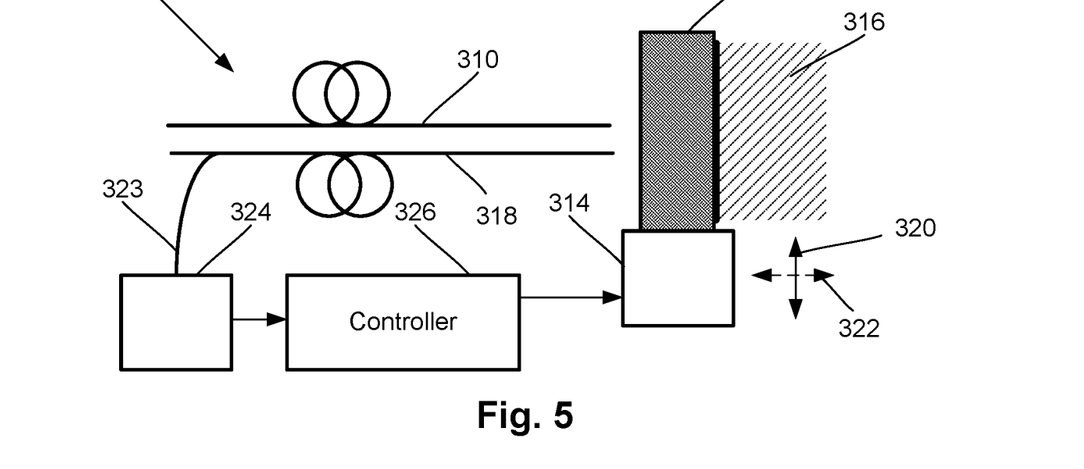
FIG. 5 shows a schematic illustration of a third embodiment of a light intensity modulator, according to the invention.

The light intensity modulators 305 of FIGS. 3 and 4 can be operated in open loop as shown above in FIGS. 3 and 4 or in a closed loop as shown in FIG. 5 (using the embodiment of FIG. 4 as an example). In the closed loop arrangement, the light intensity modulator 305 is arranged so that a portion of the reflected light beam is directed from the output optical fiber 318 along another optical fiber 323 (or through open space) to a detector 324, such as a photodiode, that provides a monitor signal to a controller 326. The monitor signal changes with changes in the light intensity. The controller 326 uses the monitor signal, as feedback, to control operation of the piezoelectric device 314 and move the GRIN lens 312' to stabilize the light intensity provided to the output optical fiber 318.

In at least some embodiment, closed loop operation of the piezoelectric-driven light intensity modulator 305 may mitigate hysteresis or creep or the like from the piezoelectric device 314. In at least some embodiments, in open loop operation, these effects may be otherwise compensated.

Figure 6:
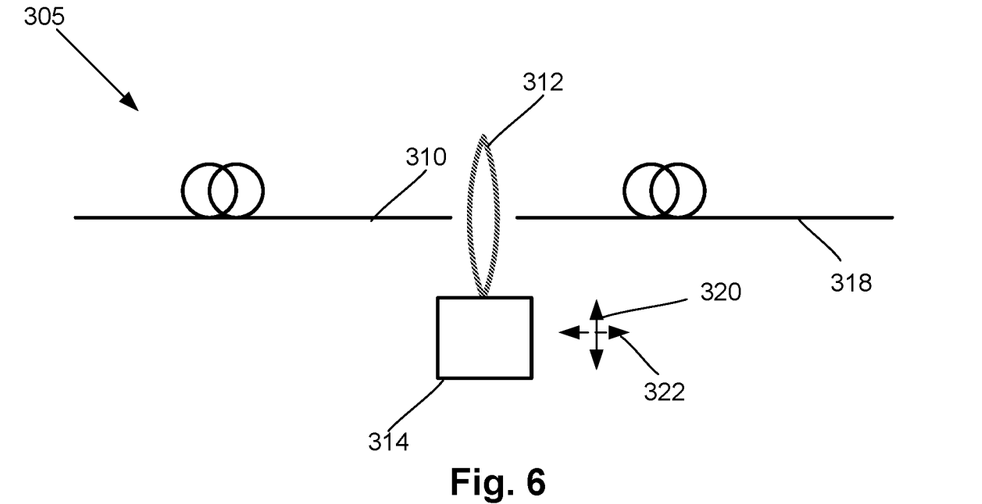
FIG. 6 shows a schematic illustration of a fourth embodiment of a light intensity modulator, according to the invention.

FIG. 6 illustrates another embodiment of a piezoelectric-driven light intensity modulator 305. The input optical fiber 310 and the output optical fiber 318 are placed on opposite sides of the lens 312 which is mounted or otherwise coupled to the piezoelectric device 314. In at least some embodiments, the input optical fiber 310 and the output optical fiber 318 are positioned in a 2f-2f imaging configuration (i.e., the tips or ends of the optical fibers 310, 318 are placed at a distance equal to twice the effective focal length of the lens 312). The piezoelectric device 314 translates or moves the lens 312 to steer the light beam exiting the lens, thereby modulating the intensity of the light in the output optical fiber 318.

Figure 7:
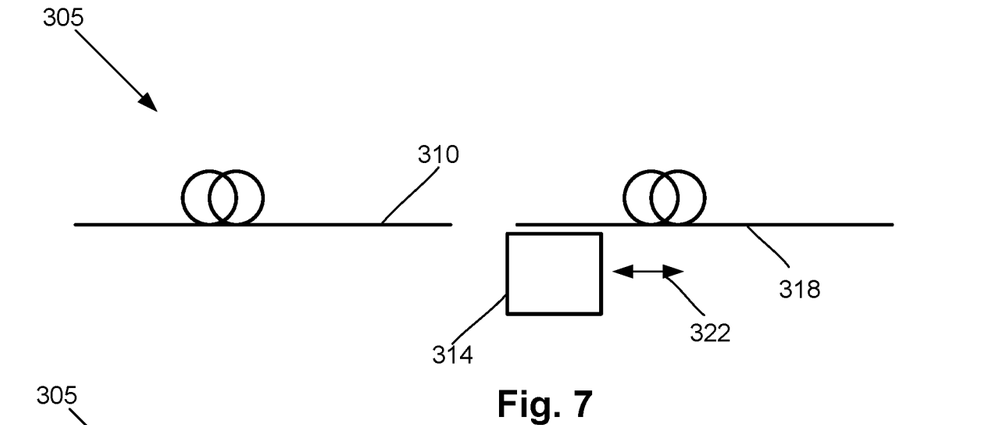
FIG. 7 shows a schematic illustration of a fifth embodiment of a light intensity modulator, according to the invention.

FIG. 7 illustrates a further embodiment of a piezoelectric-driven light intensity modulator 305. In this embodiment, the tips or ends of the input optical fiber 310 and the output optical fiber 318 are placed in close proximity (for example, within a few micrometers or tens or hundreds of micrometers) relative to each other. A piezoelectric device 314 translates or moves the output optical fiber 318 (or, alternatively, the input optical fiber 310) to steer the light beam relative to the output optical fiber. In this embodiment, the movement is parallel to the optical axes of the end portions of the two optical fibers 310, 318. Because the light expands rapidly as a function of distance from the tip of the input optical fiber 310, control of the distance between the two optical fibers 310, 318 provides control of the optical intensity in the output optical fiber 318.

Figure 8:
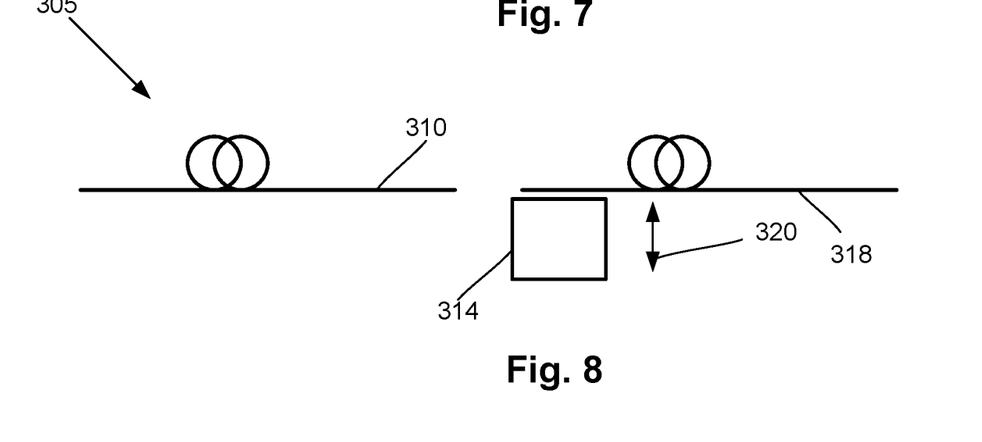
FIG. 8 shows a schematic illustration of a sixth embodiment of a light intensity modulator, according to the invention.

FIG. 8 illustrates another embodiment similar to the embodiment of FIG. 7 except that the output optical fiber 318 (or, alternatively, the input optical fiber 210) is translated by the piezoelectric device 314 in the direction transverse to the fiber axis of the input optical fiber 310 to provide intensity control.

In at least some embodiments, the light intensity modulators described herein have reduced cost compared to commercially available intensity modulators. In at least some embodiments, the light intensity modulators described herein provide reduced cost and complexity compared to microfabricated devices. In at least some embodiments, the light intensity modulators described herein provide higher speed than traditionally actuated mechanical shutters, like those based on solenoid motion. In at least some embodiments, the light intensity modulators described herein provide higher speed than liquid crystal displays (LCDs).

As described above, in at least some embodiments, the piezoelectric-driven light intensity modulator can be used to stabilize the intensity of light delivered to optically pumped magnetometers (OPMs). Such OPMs can be used for magnetic field measurement or recording systems such as, for example, magnetoencephalography (MEG) systems. Examples of magnetic field measurement or recording systems in which the embodiments described herein can be incorporated are described in U.S. Pat. Nos. 10,627,460; 10,976,386; 10,983,177; 10,996,293; 11,022,658; 11,131,729 and 11,136,647; U.S. Patent Application Publications Nos. 2020/0057116; 2019/0391213; 2020/0088811; 2020/0109481; 2020/0123416; 2020/0191883; 2020/0241094; 2020/0309873; 2020/0334559; 2020/0341081; 2020/0381128; US 2021/0011094; 2021/0015385; 2021/0041512; 2021/0063510; 2021/0139742; 2021/0369165; 2021/0373092; 2021/0369201; and 2021/0369166; U.S. patent application Ser. No. 17/338,429; and U.S. Provisional Patent Application Ser. Nos. 62/689,696; 62/699,596; 62/719,471; 62/719,475; 62/719,928; 62/723,933; 62/732,327; 62/732,791; 62/741,777; 62/743,343; 62/747,924; 62/745,144; 62/752,067; 62/776,895; 62/781,418; 62/796,958; 62/798,209; 62/798,330; 62/804,539; 62/826,045; 62/827,390; 62/836,421; 62/837,574; 62/837,587; 62/842,818; 62/855,820; 62/858,636; 62/860,001; 62/865,049; 62/873,694; 62/874,887; 62/883,399; 62/883,406; 62/888,858; 62/895,197; 62/896,929; 62/898,461; 62/910,248; 62/913,000; 62/926,032; 62/926,043; 62/933,085; 62/960,548; 62/971,132; 62/983,406; 63/031,469; 63/052,327; 63/076,015; 63/076,880; 63/080,248; 63/089,456; 63/135,364; 63/136,093; 63/136,415; 63/140,150; 63/158,700; 63/159,823; 63/170,892; 63/189,870; 63/224,768; and 63/257,491, all of which are incorporated herein by reference in their entireties. The piezoelectric-driven fiber optic intensity modulator may also find application in many other areas that require precise control of optical intensity, for example in atomic clocks, gyroscopes, or accelerometers.

The above specification provides a description of the invention and its manufacture and use. Since many embodiments of the invention can be made without departing from the spirit and scope of the invention, the invention also resides in the claims hereinafter appended.

What is claimed as new and desired to be protected by Letters Patent of the United States is:

1. A light intensity modulator, comprising:
    an input optical fiber;
    an output optical fiber;
    an optical arrangement comprising a lens, wherein the optical arrangement is configured to receive light from the input optical fiber, pass the light through the lens, and direct the light to the output optical fiber;
    a piezoelectric device coupled to the lens, wherein the piezoelectric device is configured for moving the lens to alter overlap of the output optical fiber and the light directed to the output optical fiber to modulate intensity of light in the output optical fiber;
    a detector configured to receive a portion of the light in the output optical fiber and produce a monitor signal; and
    a controller coupled to the detector and the piezoelectric device and configured to use the monitor signal to operate the piezoelectric device to modulate the intensity of the light in the output optical fiber.

2. The light intensity modulator of claim 1, wherein the lens is a GRIN lens.

3. The light intensity modulator of claim 1, wherein the piezoelectric device is configured to move the lens in a direction transverse to an optical axis of a distal portion of the input optical fiber.

4. The light intensity modulator of claim 1, wherein the piezoelectric device is configured to move the lens in a direction parallel to an optical axis of a distal portion of the input optical fiber.

5. The light intensity modulator of claim 1, wherein the piezoelectric device is configured to move the lens in a direction transverse to an optical axis of a distal portion of the input optical fiber and configured to move the lens in a direction parallel to an optical axis of a distal portion of the input optical fiber.

6. The light intensity modulator of claim 1, wherein the optical arrangement further comprises a mirror or mirrored surface positioned to receive light from the lens and reflect the light back through the lens.

7. The light intensity modulator of claim 1, wherein the lens is disposed between the input optical fiber and the output optical fiber.

8. A method for modulation light intensity, the method comprising
    directing light into the input optical fiber of the light intensity modulator of claim 1;
    transmitting the light through the optical arrangement and into the output optical fiber; and
    operating the piezoelectric device to move the lens to maintain an intensity of light in the output optical fiber within a selected range.

9. The method of claim 8, wherein operating the piezoelectric device comprises operating the piezoelectric device to move the lens in a direction transverse to an optical axis of a distal portion of the input optical fiber.

10. The method of claim 8, wherein operating the piezoelectric device comprises operating the piezoelectric device to move the lens in a direction parallel to an optical axis of a distal portion of the input optical fiber.

11. An optically pumped magnetometer, comprising:
    at least one light source;
    a vapor cell; and
    a light intensity modulator disposed between the at least one light source and the vapor cell, the light intensity modulator comprising
        an input optical fiber, wherein the input optical fiber is configured to receive light emitted by the at least one light source,
        an output optical fiber, wherein the output optical fiber is configured to transmit light for illumination of the vapor cell,
        an optical arrangement comprising a lens, wherein the optical arrangement is configured to receive light from the input optical fiber, pass the light through the lens, and direct the light to the output optical fiber, and
        a piezoelectric device coupled to the lens, wherein the piezoelectric device is configured for moving the lens to alter overlap of the output optical fiber and the light directed to the output optical fiber to modulate intensity of light in the output optical fiber.

12. A magnetic field measurement system, comprising:
    the optically pumped magnetometer of claim 11; and
    a detector configured to measure light transmitted through the vapor cell.

13. The magnetic field measurement system of claim 12, wherein the piezoelectric device is configured to move the lens in a direction transverse to an optical axis of a distal portion of the input optical fiber.

14. The magnetic field measurement system of claim 12, wherein the piezoelectric device is configured to move the lens in a direction parallel to an optical axis of a distal portion of the input optical fiber.

15. The magnetic field measurement system of claim 12, wherein the piezoelectric device is configured to move the lens in a direction transverse to an optical axis of a distal portion of the input optical fiber and configured to move the lens in a direction parallel to an optical axis of a distal portion of the input optical fiber.

16. The magnetic field measurement system of claim 12, further comprising
    a detector configured to receive a portion of the light in the output optical fiber and produce a monitor signal; and
    a controller coupled to the detector and the piezoelectric device and configured to use the monitor signal to operate the piezoelectric device to modulate the intensity of the light in the output optical fiber.

17. The optically pumped magnetometer of claim 11, wherein the piezoelectric device is configured to move the lens in a direction transverse to an optical axis of a distal portion of the input optical fiber.

18. The optically pumped magnetometer of claim 11, wherein the piezoelectric device is configured to move the lens in a direction parallel to an optical axis of a distal portion of the input optical fiber.

19. The optically pumped magnetometer of claim 11, wherein the piezoelectric device is configured to move the lens in a direction transverse to an optical axis of a distal portion of the input optical fiber and configured to move the lens in a direction parallel to an optical axis of a distal portion of the input optical fiber.

20. The optically pumped magnetometer of claim 11, further comprising a detector configured to receive a portion of the light in the output optical fiber and produce a monitor signal; and
    a controller coupled to the detector and the piezoelectric device and configured to use the monitor signal to operate the piezoelectric device to modulate the intensity of the light in the output optical fiber.

* * * * *